United States Patent [19]

Yamamoto et al.

[11] Patent Number: 4,652,826

[45] Date of Patent: Mar. 24, 1987

[54] APPARATUS AND PROCESS FOR GENERATING A HOMOGENEOUS MAGNETIC FIELD

[75] Inventors: Syunji Yamamoto, Itami; Tadatoshi Yamada, Kobe; Masao Morita, Itami; Tetsuya Matsuda, Kawanishi, all of Japan

[73] Assignee: Mitsubishi Denki Kabushiki Kaisha, Tokyo, Japan

[21] Appl. No.: 710,163

[22] Filed: Mar. 11, 1985

[30] Foreign Application Priority Data

Mar. 9, 1984 [JP] Japan ................................. 59-46267

[51] Int. Cl.⁴ .......................................... G01R 33/20
[52] U.S. Cl. ..................... 324/320; 324/318
[58] Field of Search ............... 324/300, 309, 318, 319, 324/320, 322, 307

[56] References Cited

U.S. PATENT DOCUMENTS

| | | | |
|---|---|---|---|
| 4,284,950 | 8/1981 | Burl et al. | 324/320 |
| 4,506,247 | 3/1985 | Vermilyea | 324/320 |
| 4,509,030 | 4/1985 | Vermilyea | 324/320 |
| 4,591,789 | 5/1986 | Glover et al. | 324/307 |

OTHER PUBLICATIONS

IBM Technical Disclosure Bulletin, vol. 19, No. 9, 1977, pp. 3517–3519.

Primary Examiner—Michael J. Tokar
Attorney, Agent, or Firm—Leydig, Voit & Mayer

[57] ABSTRACT

A process and apparatus for correcting a crude magnetic field of a main field generator having correcting magnetic field generators associated therewith to produce a substantially homogeneous corrected field. The process comprises the steps of measuring the distribution of said crude magnetic field at a plurality of points, expressing the crude magnetic field at each of the plurality of different measured points by a polynomial equation which contains a main homogeneous magnetic field component, successively higher order inhomogeneous magnetic field components, and a residual, determining the magnetic field output for the correcting generators such that the successively higher order inhomogeneous magnetic field components of the crude magnetic field are completely cancelled by the magnetic field outputs, respectively, of the correcting generators, and producing and superpositioning on the crude magnetic field the determined magnetic field output from the correcting generators.

6 Claims, 10 Drawing Figures

FIG.6(c) ⊺10μT

APPARATUS AND PROCESS FOR GENERATING A HOMOGENEOUS MAGNETIC FIELD

BACKGROUND OF THE INVENTION

The present invention relates to an apparatus and process for generating a spatial magnetic field having extremely high homogeneity.

FIG. 1 is a flow chart for determining an optimum output of a conventional correcting apparatus which acts on a crude magnetic field, generating a highly homogeneous magnetic field, as disclosed, for example, in the IBM Technical Disclosure Bulletin (Vol. 19, No. 9, 1977, pp. 3517-3519). In this example, a shim coil is used as the magnetic field correcting apparatus. The shim coil is capable of independently generating an output that corresponds to a given inhomogeneous component of the crude magnetic field. By installing many shim coils of different kinds or having different orders of magnetic field magnitude, it is possible to remove many inhomogeneities in the crude magnetic field.

In FIG. 1, reference numeral 1 denotes an arithmetic unit, 2 denotes optimization of a primary correction current driven by the arithmetic unit 1, 3 denotes optimization of a secondary correction current, reference numerals 4 and 5 denote feedback lines to the arithmetic unit 1 and the optimization of primary correction current, 6 denotes the completion of optimization by the shim coil, and 7 denotes NMR (nuclear magnetic resonance) spectrometers. The NMR spectrometer 7 subjects an FID (free induction decay) signal pulse received by a pulse NMR method to the Fourier transformation, and measures the homogeniety of the magnetic field in the measured sample by relying upon a half-value width of the signal pulse which has been Fourier-transformed. When the homogeneity of the magnetic field is poor, the FID signal pulse attenuates quickly. When the homogeneity of the magnetic field is extremely poor, it becomes difficult to carry out the measurement.

In the region where the correction output is generated, a correction magnetic field (not shown) has been generated already to correct and highly homogenize the crude magnetic field distribution.

First, the step of correcting the magnetic field is initiated by inputting a suitable start instruction to the arithmetic unit 1. That is, in a group of shim coils that generate primary magnetic field outputs, a particular shim coil is set at a given current value by the arithmetic unit 1, to initiate the optimization of the primary correction current as denoted at 2. Under the condition where the sim coil is set at a given current value and is generating a correcting magnetic field, the NMR spectrometer 7 measures the magnetic field homogeneity and compares it with the homogeneity under the previous condition where the correcting magnetic field is not generated by the shim coil. In this case, if the homogeneity is deteriorating, the intensity of electric current flowing through the shim coil is changed by the arithmetic unit 1 to change the correction magnetic field intensity generated by the shim coil. Then, the homogeneity of the magnetic field is measured and compared by the NMR spectrometer 7 in the same manner as above. A further possibility for correction is that both the direction of current flowing through the shim coil and the intensity thereof may be changed in order to change both the intensity of the correcting magnetic field generated by the shim coil and, again, the direction thereof, and the homogeneity of the magnetic field is measured and compared by the spectrometer 7 as above. The direction of current flowing in the shim coil is properly set when it becomes obvious through iterative measurement by the NMR spectrometer 7 that the homogeneity of the magnetic field is improved compared with previous tests when no current was supplied to the shim coil, after having repeated the trial and error many times. Next, the current flowing into the shim coil must be optimized. The object of this optimization is to adjust the correcting magnetic field generated by the shim coil until the distribution of the crude magnetic field no longer contains a magnetic field component which is the same as the correcting magnetic field component. Originally the homogeneity of the magnetic field is $\alpha$ where a current I is flowing into the shim coil. The current I flowing into the shim coil is then set at I+I by the arithmetic unit 1, and a homogeneity + of the generated magnetic field is measured by the NMR spectrometer 7. The current has now been changed by an amount $\Delta I$ toward the direction to increase the homogeneity of the magnetic field provided $\alpha + \Delta \alpha < \alpha$. Therefore, the current flowing through the shim coil is changed until $(d\alpha)/(dI)=0$ is obtained.

Thus, the optimization of a shim coil is completed among the primary shim coils. Even of the remaining shim coils is optimized among the group of primary shim coils by the same method as mentioned above. As the optimization of all primary shim coils is completed, the optimization of the primary correction current is completed as denoted by 2. However, when $(d\alpha)/(dI)=0$ does not hold true, it means that the optimization is not possible. Therefore, a signal is sent to the arithmetic unit 1 via the feedback line 4 to inform that the correction current is not optimized, whereby the step of correction is halted or the program proceeds to the next step though the optimum correction has not been accomplished.

After the primary correction current is optimized as described above, the secondary correction current is optimized as denoted by 3 by the NMR spectrometer 7 which repetitively measures the homogeneity in the magnetic field, and whereby the optimization is completed as denoted by 6.

Further, in order for the FID signal to be of sufficient intensity to be observed, the crude magnetic field must have a minimum homogeneity before it is corrected by the shim coils. When the measuring region within a crude field distribution is wide, the magnetic field usually varies in large amounts and the homogeneity in the magnetic field decreases as compared with that of the same field in a smaller region. Therefore, when wide regions are to be corrected and highly homogenized, the magnetic field homegeneity must be higher than that of the minimum measurable homogeneity of a smaller region. Otherwise, it becomes impossible to measure the homogeneity in the magnetic field by FID.

There are two types of shim coils, i.e., superconductive shim coils and ordinary conductive shim coils. The superconductive shim coils are used when the apparatus for generating crude magnetic field consists of a superconductive coil, and are installed in expensive liquid helium. To adjust the magnetic field generated by the shim coils, it is necessary to supply an electric current at all times to heat the heater of a heater-equipped switch which is called the permanent switch and which is also installed in the liquid helium. When the adjustment is effected over extended periods of time, therefore, the liquid helium evaporates in considerable amounts.

The ordinary conductive shim coils are used at ordinary temperatures and are obtained by winding an ordinary electric wire such as copper wire or aluminum wire.

According to the conventional apparatus for generating a highly homogeneous magnetic field constructed as described above, the magnetic field is corrected and homogenized on a trial-and-error basis. As the number of shim coils increases, therefore, the time required for the correction increases strikingly making it difficult to quickly obtain a highly homogeneous magnetic field. When the superconductive shim coils are used, furthermore, expensive liquid helium is consumed in tremendous amounts making the adjustment operation extremely costly. When the homogeneity in the crude magnetic field is poor, furthermore, the FID signal pulses are attenuated very quickly to make it difficult to highly homogenize the magnetic field.

SUMMARY OF THE INVENTION

The present invention has as its object to eliminate the defects inherent in the above-mentioned conventional art for highly homogenizing a magnetic field. Accordingly, the invention provides an apparatus and a process for generating a highly homogeneous magnetic field by measuring the distribution of a crude magnetic field at several points, computing an optimum magnetic field that should be generated by a correcting magnetic field generating apparatus, and providing the correcting magnetic field by a generating apparatus.

BRIEF DESCRIPTION OF THE DRAWINGS

FIGS. 6(a), 6(b) and 6(c) are diagrams showing magnetic field distributions after the correction.

In the drawings, the same symbols represent the same or corresponding portions.

DESCRIPTION OF THE PREFERRED EMBODIMENT

Figure 1:
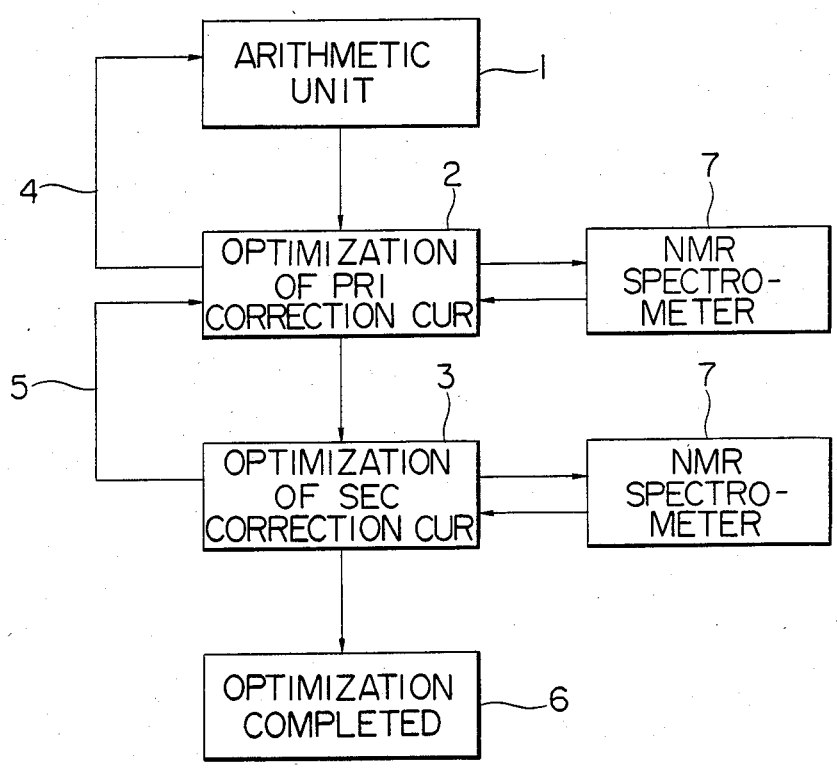
FIG. 1 is a flow chart for highly homogenizing a magnetic field according to conventional art.

First, described below is a method of correcting a magnetic field employed by the present invention.

When a notched solenoid coil is used to generate a highly homogeneous megnetic field with inhomogeneous magnetic field components, the generated magnetic field Bz near the center of the coil is given by the following equation.

$$Bz(\gamma, \theta) = \quad (1)$$

$$B_0 + \epsilon_6 P_6(\cos\theta)\left(\frac{\gamma}{a}\right)^6 + \epsilon_8 P_8(\cos\theta)\left(\frac{\gamma}{a}\right)^8 + \ldots$$

where a denotes a radius of the solenoid coil, Pn denotes LaGrange's polynomial of the n-th order, and $\epsilon_n$ denotes a constant determined by the shape of the coil.

The equation (1) indicates that there is generated a highly homogeneous magnetic field which does not contain inhomogeneous magnetic field components of smaller than the fifth order.

However, since there exists an upper limit in the precision for manufacturing the coil, and the environment for installing the coil cannot be made completely nonmagnetic, there will not be generated the magnetic field as given by the equation (1). Rather, it should be considered that the magnetic field will contain inhomogeneous magnetic field components of smaller than the fifth order.

Discussed below is the magnetic field distribution where a number of weak and inhomogeneous magnetic field components are contained in a homogeneous magnetic field that does not spatially change. Further, a method of cancelling inhomogeneous magnetic field components will be considered below.

A given magnetic field B is expressed by the following equation in terms of scalar potential $\phi$, $$B = -\nabla\phi \quad (2)$$

where, by using an orthogonal sphere expansion, $\phi$ is usually expressed by the following equation, $$\phi = -\sum_{n=1}^{\infty}\sum_{m=0}^{\infty}\gamma^n P_n^m(\cos\theta)[A_n^m\cos m\phi + B_n^m\sin m\phi] \quad (3)$$

where An and Bn are constants, and $\gamma$, $\theta$ and $\phi$ are variables expressed as polar coordinates.

When the magnetic field is to be corrected, Cartesian coordinates are generally used since they can be easily corresponded to the outputs of the magnetic field correcting coil. Therefore, the Cartesian coordinate representation will be used hereinbelow.

Considered below is the case where a main magnetic field component Bo that does not spatially change is represented by the Z-axis, and a given inhomogeneous magnetic field component B' is superposed on the main magnetic field component Bo where $|Bo+B'|/|Bo| << 1$. Here, $$|Bo + B'| = Bo + B'z + \frac{B'x^2 + B'y^2}{2Bo} + \ldots$$

$$\simeq Bo + B'z$$

Therefore, the inhomogeneous magnetic field component is represented by the component Z in the same direction as that of the main magnetic field. The magnetic field component in the direction of the Z-axis is given by the following conversion equation, $$Bz = -(\nabla\phi\gamma\cos\theta - \nabla\phi\theta\sin\theta) \quad (4)$$

$$= -\cos\theta\frac{\delta\phi}{\delta\gamma} + \frac{\sin\theta}{\gamma}\frac{\delta\phi}{\delta\theta}$$

By inserting the equation (2) into the equation (4), the components are represented by Cartesian coordinates of progressively higher order.

$$Bz = Bo + A_1x + A_2y + A_3z + A_4\left(z^2 - \frac{1}{2}(x^2 - y^2)\right) + \quad (5)$$

$$A_5zx + A_6zy + A_7xy + A_8(x^2 - y^2) +$$

$$A_9z\left(z^2 - \frac{3}{2}x^2 - \frac{3}{2}y^2\right) +$$

$$A_{10}x(4z^2 - x^2 - y^2) + A_{11}y(4z^2 - x^2 - y^2) +$$

$$A_{12}x(x^2 - 3y^2) + A_{13}y(3x^2 - y^2) + A_{14}xyz +$$

$$A_{15}z(x^2 - y^2) + \cdots$$

That is, Bz is the superposition of all terms in the equation (5). In the equation (5), terms other than the first term are magnetic field components that undergo spatial change. To highly homogenize the magnetic field, it is essential that these inhomogeneous magnetic field components not be present. In order to remove inhomogeneous magnetic field components, the magnetic field is corrected using a shim coil which is a special coil having a magnetic field component that is in agreement with a variable of only one term among the terms in the equation (5). The shim coil is capable of generating an independent magnetic field component, and makes it possible to correct any magnetic field distribution. The shim coil to be mounted on the solenoid coil includes a pair of circular coils or a combination of saddle-type coils. Components and amplitudes of the inhomogeneous magnetic field cannot be determined unless the magnetic field that is actually generated is measured. To obtain a highly homogeneous magnetic field, therefore, a number of shim coils have to be prepared. Therefore, tremendously laborious work is required to adjust the magnetic field distribution and to determine an optimum adjustment value for obtaining a highly homogeneous magnetic field.

The present invention employs the method of least squares in order to easily find optimum values for correcting the magnetic field. That is, the crude magnetic field distribution generated by the main coil is expressed by a homogeneous magnetic field component Bo, many shim coil functions of the magnet, and other terms, relying upon the method of least squares. In this case, the magnetic field Bz at a given point is expressed by the following equation, $$Bz(x,y,z) = Bo + a_1f_1 + a_2f_2 + \ldots + a_nf_n + Rn(x,y,z) \quad (6)$$

where, $f_1$, $f_2$,—, $f_n$ denote magnetic field output functions of the shim coils, $a_1$,—, $a_n$ denote amplitudes, and Rn denotes a residual that cannot be expressed by a shim coil functions.

Here, the term crude magnetic field means the distribution of magnetic field before corrected.

If the shim coils are excited, the equation (6) can be expressed as follows:

$$Bz(x,y,z) = Bo + (a_1f_1 - b_1f_1) + (a_2f_2 - b_2f_2) + \ldots + \quad (7)$$

$$(a_nf_n - b_nf_n) + Rn(x,y,z) + \sum_{m=1}^{n} R'm(x,y,z)$$

where, R'm denotes an error magnetic field component other than $f_1$ to $f_n$, that is contained in a small amount in the magnetic field output of each of the shim coils.

If the exciting current is so adjusted that the magnetic field $a_nf_n$ obtained from the distribution of the crude magnetic field is completely cancelled by the magnetic field output $b_nf_n$ of the shim coils, i.e., if the exciting current is so adjusted that $a_n = b_n$, then the magnetic field at a given point is expressed as, $$Bz(x,y,z) = Bo + Rn(x,y,z) + \sum_{m=1}^{n} R'm(x,y,z) \quad (8)$$

It is not practical to install a large number of shim coils. Generally, therefore, about ten shim coils are used to remove inhomogeneous magnetic field components of low orders. Within such a practical range, a relation $|Rn| >> |\Sigma R'm|$ holds true, and no problem arises in regard to the precision in the magnetic field outputs of shim coils from the standpoint of correcting the magnetic field distribution.

A minimum value $R_n^{min}$ and maximum value $R_n^{max}$ of the residual in the measured region have been numerically found. Therefore, the magnetic field homogeneity $\alpha$ obtained at this moment can be presumed prior to correcting the magnetic field distribution by the shim coils, as given by the following equation, $$\alpha = \left| \frac{B\max - B\min}{B\max + B\min} \right| \quad (9)$$

$$\approx \frac{R_n^{max} - R_n^{min}}{2Bo}$$

Figure 2:
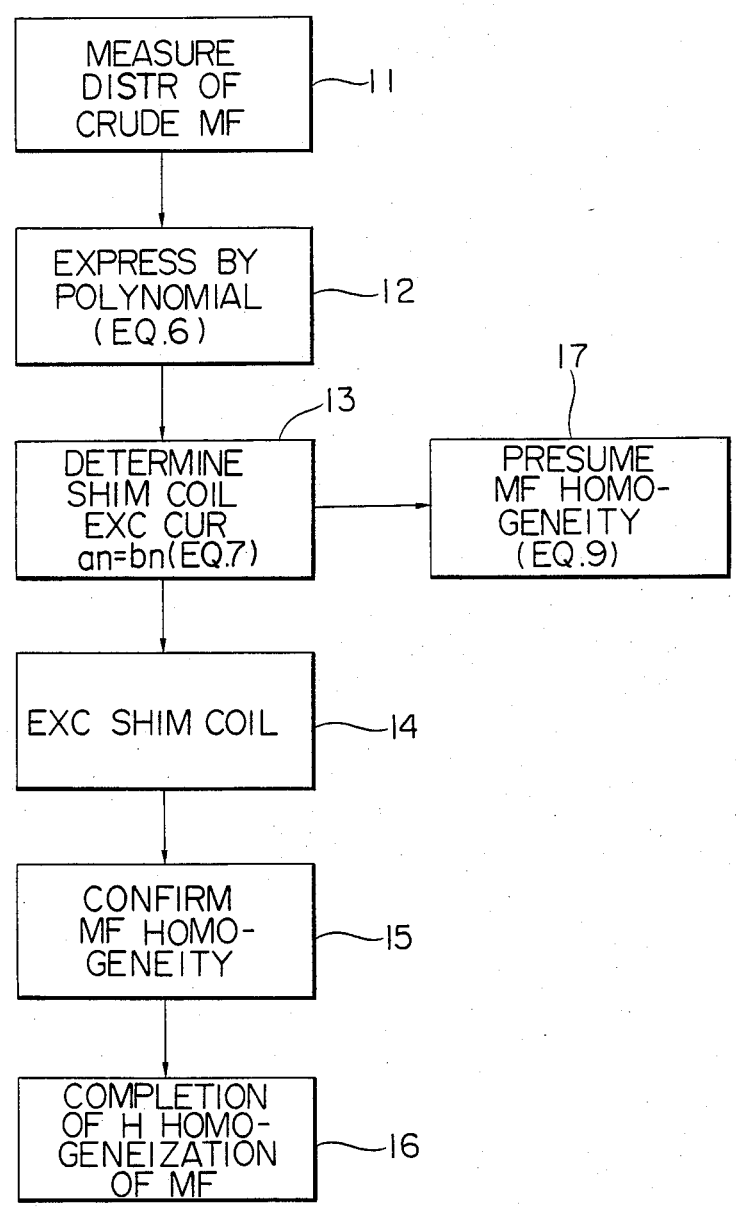
FIG. 2 is a flow chart for correcting the magnetic field according to the present invention.

FIG. 2 is a flow chart which illustrates the abovementioned method of highly homogenizing the magnetic field, where step 11 measures the distribution of the crude magnetic field, step 12 expresses the distribution of the crude magnetic field by a polynomial based upon the equation (6), step 13 determines a shim coil exciting current that is readily obtained from the polynomial expression at step 12, step 14 excites the shim coil according to the determined shim coil current, step 15 confirms the homogeneity in the magnetic field by measuring the distribution of magnetic field, and step 16 expresses the completion of high homogeneous correction of magnetic field. Further, step 17 presumes the homogeneity in the magnetic field from the residual magnetic field component after the shim coil exciting current has been determined at step 13.

The distribution of the crude magnetic field is measured at step 11 at a plurality of coordinate points; i.e., the magnetic field in a region that is small enough to be regarded as a point is measured at each of the coordinate points. The measured distribution of the crude magnetic field is expressed by a polynomial such as the equation (6) in step 12. By selecting n kinds of shim coils for correcting the magnetic field, the functions $f_1$ to $f_n$ can be expressed as concrete variables. Values $a_1$ to $a_n$ are so determined that $\Sigma R_n^2$ becomes a minimum for all of the measured points, and are expressed by the equations for the cases where the shim coils are excited, for example, equation (7). Then, values $b_1$ to $b_n$ are so determined that $a_n - b_n = 0$ (n = 1, 2,—, n), the shim coil exciting current is determined at step 13, and the shim coil is immediately excited at step 14. Homogeneity of the magnetic field is confirmed at step 15 by measuring the distribution of the magnetic field corrected by the exciting outputs of shim coils. The homogeneity $\alpha$ in the magnetic field can be presumed as given by the equation (9) from a maximum value and a minmum value in the residual magnetic field component Rn at the time the exciting current of shim coil is determined. By comparing the homogeneity of magnetic field presumed at step 17 with the homogeneity of magnetic field confirmed at step 15, it can be confirmed whether the magnetic field was properly corrected. If it can be confirmed experimentally that the method of correcting the magnetic field of the present invention is proper, the homogeneity of magnetic field needs not necessarily be confirmed at step 15; i.e., this step 15 may be passed.

Figure 3:
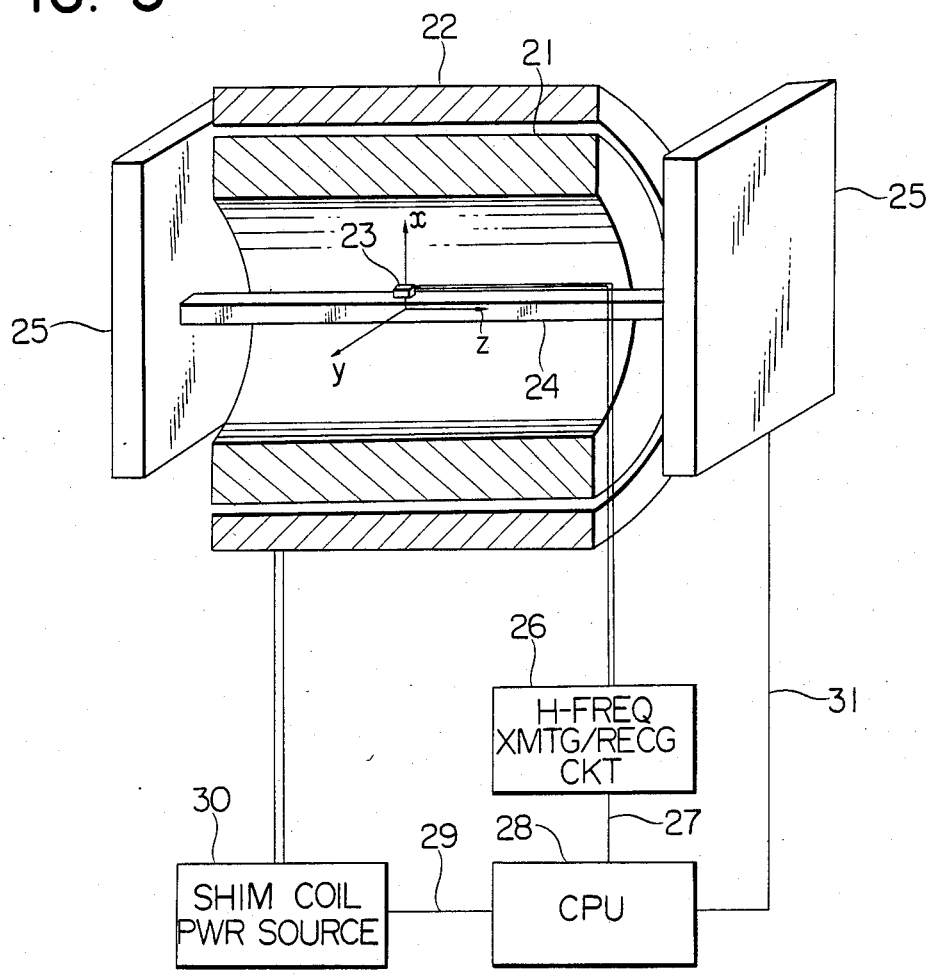
FIG. 3 is a perspective section view of an apparatus for generating a highly homogeneous magnetic field according to an embodiment of the present invention.

An embodiment of the present invention will be explained hereinbelow. In FIG. 3, reference numeral 22 denotes a superconductive shim coil which generates a d-c correcting magnetic field for correcting the distribution of a crude magnetic field generated by a superconductive main coil 21. The two coils 21, 22 are cooled by being immersed in liquid helium (not shown) to maintain the superconductive condition. Reference numeral 23 denotes a pulse NMR probe which measures the magnetic field at a given coordinate point and which is placed on a probe placing plate 24. The probe placing plate is equipped with a probe moving device 25 so that the pulse NMR probe can be moved to any point in the bore of the superconductive main coil 21. The pulse NMR probe 23 is connected to a high-frequency transmitting/receiving circuit 26, and is connected to a computer 28 via an I/O bus 27. Connection is further made, via an I/O bus 29, to a shim coil-exciting power source 30 of which a d-c output terminal is connected to the superconductive shim coil 22. The probe moving device 25 is connected to the computer via an I/O bus 31. Coordinate axes (x, y, z) are shown in FIG. 3.

The magnetic field generated by the superconductive main coil 21 at a given coordinate point $(x_1, y_1, z_1)$ is measured by the pulse NMR probe 23 that is placed at that coordinate point. Responsive to instructions sent from the computer 28 via I/O bus 31, the probe moving device 25 moves the pulse NMR probe 23 in a three-dimensional manner so that it can be moved to any point in the bore of the superconductive main coil 21. The pulse NMR probe 23 receives, from the high-frequency transmitting/receiving circuit 26, high-frequency signals that are necessary for measuring the magnetic field relying upon the nuclear magnetic resonance method, and generates nuclear magnetic resonance in from the sample tested by the probe. The signals generated by the phenomenon of resonance are received again by the high-frequency transmitting/receiving circuit where they are processed, and the data thereof are input to the computer 28 via the I/O bus 27. The computer 28 is also connected to the probe moving device 25 via I/O bus 31. Therefore, the computer 28 is served with coordinates where the magnetic field is measured, and with values of the magnetic field at the coordinates. Responsive to instructions from the computer 28, the pulse NMR probe 23 changes its position successively to measure the magnetic field at required coordinate points. These data are all input to the computer 28. At the moment where the measurement of magnetic field is all finished, the computer readily finds, based on these measured data, the correcting magnetic field output necessary for the superconductive shim coil 22 to correct the distribution of magnetic field. Then, according to conversion values of the magnetic field vs. electric current that have been found in advance, the electic current is supplied from the shim coil power source 30 to the superconductive shim coil 22 via I/O bus 29 in order to generate a correcting magnetic field. Usually, the superconductive coil is operated by a permanent current mode system which requires the power supply only at the moment of excitation or de-magnetization. Therefore, a switch equipped with a heater called a permanent current switch is installed in liquid helium, and the electric current is allowed to flow to the heater only at the moment of excitation or de-magnetization. The shim coil power source 30 includes a power source for the heater. The current starts to flow to the heater at the moment when the computer 28 derives a correcting magnetic field output for the superconductive shim coil 22, i.e., at the moment when the computer 28 derives a current for the superconductive shim coil 22.

Figure 4:
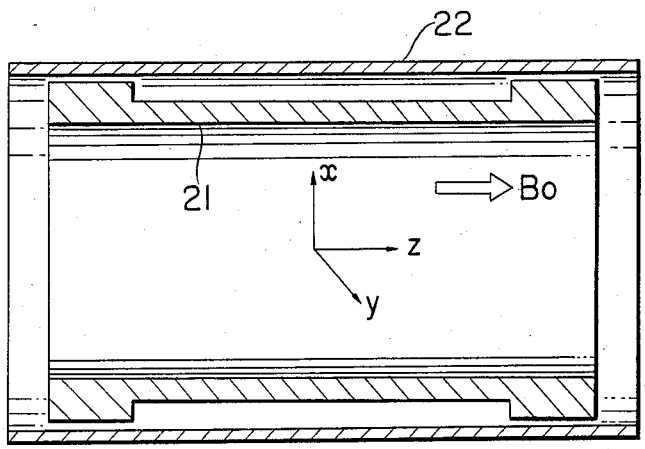
FIG. 4 is a section view of test equipment for verifying the method of the present invetion.
Figure 5A:
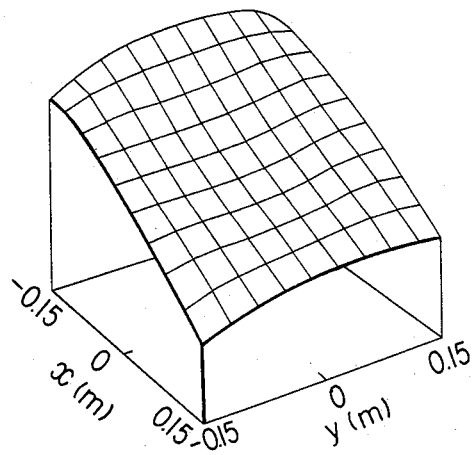
FIGS. 5(a), 5(b) and 5(c) are diagrams showing magnetic field distributions before the correction during the verification testing.
Figure 5B:
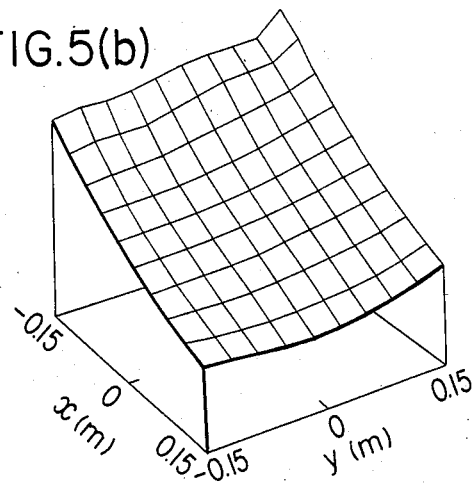
Figure 5C:
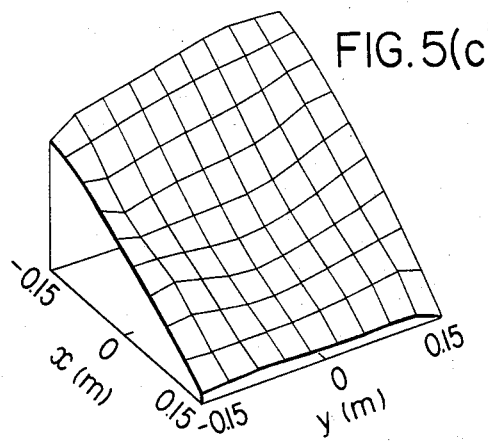
Figure 5C:
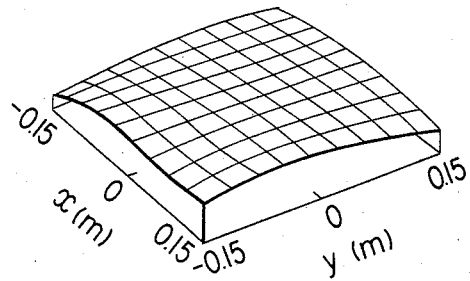

To verify the present invention, use is made of equipment shown in FIG. 4. The equipment includes the superconductive main coil 21 having an inner diameter of 1 m and a length of 1.86 m, and ten kinds ($Z^0$, $Z^1$, $Z^2$, $Z^3$, X, Y, ZX, ZY, XY, $X^2$-$Y^2$) of superconductive shim coils 22. The experiment for correcting the magnetic field is conducted with the magnetic field at the center being set at 0.35 T. The coordinate axes (x, y, z) and the main magnetic field component Bo are indicated by arrows. A cube measuring 0.3 m on a side with the origin as a center is selected as a region where the magnetic field is to be highly homogenized, and magnetic field distributions on three representative planes, i.e., z=−0.15 m, z=0, z=0.15 m in the region are shown in FIGS. 5(a), 5(b) and 5(c). Measurements are taken at seven points on each axis maintaining a distance of 50 mm between points. Therefore, measurements are taken at 343 points in the cube. Every drawing emphasizes inhomogeneous magnetic field components only that are superimposed on the main magnetic field. With the shim coil functions as variables, least squares are calculated based upon the magnetic field components of the shim coils of in Table 1 appearing later, to obtain the following equation, $$B(x,y,z) = 0.349944551 - 0.16 \times 10^{-3}x + 0.34 \times 10^{-4}y - \quad (10)$$

$$0.79 \times 10^{-4}z - 0.20 \times 10^{-3}\left\{ z^2 - \frac{1}{2}(x^2 + y^2) \right\} -$$

$$0.15 \times 10^3 zx + 0.73 \times 10^{-4} zy - 0.68 \times 10^{-4}$$

$$xy + 0.33 \times 10^{-4}(x^2 - y^2) - 0.18 \times 10^{-4}z$$

$$\left( z^2 - \frac{3}{2}x^2 - \frac{3}{2}y^2 \right) + R(x,y,z)(T)$$

$$R^{max} = 4.7 \times 10^{-6}(T) \; R^{min} = -1.3 \times 10^{-5}(T)$$

Figure 6A:
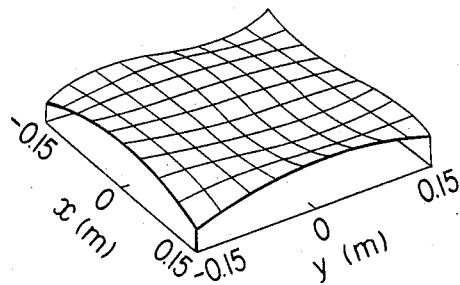
Figure 6B:
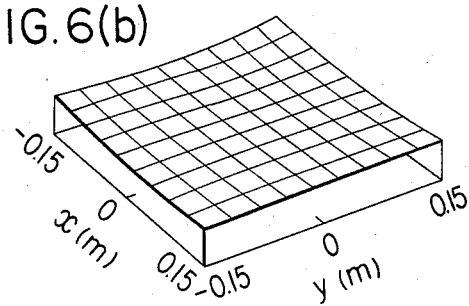

In accordance with equation (10), the shim coils are excited to generate a magnetic field having the same coefficients and absolute values but opposite signs. Here, since it is the principal object to highly homogenize the magnetic field, correction of the zero order is not effected. Therefore, equation (10) does not contain correction for the terms of zero order. Magnetic fields generated by the shim coils by flowing currents thereto have been found by calculation beforehand. Therefore, the electric current is supplied according to these values in order to correct the magnetic field. FIGS. 6(a), 6(b) and 6(c) show magnetic field distributions after correction, as measured by the pulse NMR method. For the purpose of easy comparison, the magnetic field is distributed on the same planes as the magnetic field distributions before the correction of FIG. 5. It will be recognized that the correction of the magnetic field distribution by the shim coils helps reduce the amplitudes of inhomogeneous magnetic field components, and that the distribution curves which irregularly change contribute to smoothing the positive and negative signals in the magnetic field gradient. From these facts, it can be considered that the magnetic field is corrected substantially properly.

Next, the results of calculation will be compared with the results of experiments. Presumed homogeneities in the magnetic field found by calculation and values found through the correcting experiment are shown in Table 2 appearing later. In Table 2, (1) represents values in a cube where $a=0.1$ m, (2) represents values in a cube where $a=0.2$ m, and (3) represents values in a cube where $a=0.3$ m. Compared with the homogeneity in the magnetic field distribution before the correction, the values after the correction shown in Table 2 are so small that it can be considered that the magnetic field is effectively corrected. After the correction, however, the homogeneity which is experimentally found is poorer than the presumed value. This is due to the factors that the current which flows into the shim coil is determined not upon the experimentally found value but upon the calculated output, which produces a slight difference, that there is limit on the measuring precision, and that design involves error of about 1% for flowing the electric current into the shim coil. If these error factors involved in the experiments are removed, the presumed value will come into better agreement with the experimentally found value. It is important to make sure to what extent the shim coils are effectively utilized. For this purpose, therefore, the magnetic field distribution is measured after the correction, and the result after the magnetic field is corrected is judged by adapting the method of least squares based upon shim coil functions. Table 3 appearing later shows coefficients of equations of magnetic field distributions obtained by the method of least squares. From Table 3, it will be understood that the shim coil of the first order decreases the inhomogeneous magnetic field components down to several percent, the shim coil of the second order decreases such components down to several tens of a percent, and the shim coil of the third order is not effective to correct the magnetic field. The number of coils for constituting the superconductive shim coil 22 increases with the increase in the order, whereby it becomes difficult to set the electric current, and the calculated output tends to be deviated from the found value. Further, as the order of the components increases, increasing error results from even a slight difference in the set current, making it difficult to precisely adjust the shim coil current.

Although the above embodiment has dealt with the case where the crude magnetic field generator and the correcting magnetic field generator are both constituted by the superconductive coils, these two coils may be ordinarily conductive coils or permanent magnets, as a matter of course. Further, they may be combinations of some of these three magnetic field generators, i.e., superconductive coil, ordinary conductive coil and permanent magnet.

In the above embodiment, furthermore, the magnetic field was measured by the pulse NMR method. However, the magnetic field may be measured by the CWNMR method or by using a Hall element.

Further, though the above embodiment has dealt with an unmanned fully automatic measuring system employing a computer, there of course exists a measuring system which is not fully automatic. That is, a system in which, in measuring the distribution of a magnetic field, the magnetic field at each of the coordinate points is recorded on a recording paper, the thus recorded data are input to the computer which works only to indicate the distribution of magnetic field in terms of polynominal, and the shim coil power source is manually operated according to a correcting current for shim coil that is produced. Thus, when the manual operation or the off-line operation is included, the distribution of magnetic field may be expressed in terms of a polynomial. This can be accomplished by a low-performance computer without requiring the functions to control various devices. Therefore, the apparatus for generating a highly homogeneous magnetic field can be cheaply provided.

EFFECT OF THE INVENTION

According to the present invention as described above, the output of the shim coil is not determined on a trial-and-error basis, but is produced readily by a computer through a single measurement of the magnetic field distribution. Therefore, the time required for highly homogenizing the magnetic field can be greatly reduced, and liquid helium is consumed by small amounts by the superconductive shim coil. Further, the time required for highly homogenizing the magnetic field increases very little despite the increase in the types of shim coils.

TABLE 1

| ORDER | DESIGNATION | MAGNETIC FIELD OUTPUTS |
|---|---|---|
| 0 | $Z^0$ shim coil | $b_0$ |
| 1 | X | $b_1 x$ |
|   | Y | $b_2 y$ |
|   | Z | $b_3 z$ |
|   | $Z^2$ | $b_4 \{z^2 - 0.5(x^2 + y^2)\}$ |
| 2 | ZX | $b_5 zx$ |
|   | ZY | $b_6 zy$ |
|   | XY | $b_7 xy$ |
| 3 | $X^2 - Y^2$ | $b_8 (x^2 - y^2)$ |
|   | $Z^3$ | $b_9 z(z^2 - 1.5x^2 - 1.5y^2)$ |

$b_0$–$b_9$: Constants

TABLE 2

|  | After Correction |  |  |  |  |  | Before Correction Experimental Value |
|---|---|---|---|---|---|---|---|
|  | Estimated Value |  |  | Experimental Value |  |  |  |
|  | $R^{max}$ (T) | $R^{min}$ (T) | $\alpha$ | $B^{max}$ (T) | $B^{min}$ (T) | $\alpha$ | $\alpha$ |
| (1) 0.1 m | $1.2 \times 10^{-6}$ | $-6.8 \times 10^7$ | $2.6 \times 10^{-6}$ | 0.3498821 | 0.3498796 | $3.6 \times 10^{-6}$ | $5.1 \times 10^{-5}$ |
| (2) 0.2 m | $1.8 \times 10^{-6}$ | $-1.6 \times 10^7$ | $4.8 \times 10^{-6}$ | 0.3498855 | 0.3498764 | $1.3 \times 10^{-5}$ | $8.7 \times 10^{-5}$ |
| (3) 0.3 m | $4.7 \times 10^{-6}$ | $-1.3 \times 10^7$ | $2.5 \times 10^{-5}$ | 0.3498932 | 0.3498689 | $3.5 \times 10^{-5}$ | $1.3 \times 10^{-4}$ |

TABLE 3

| ORDER | TYPE | BEFORE CORRECTION (A) | AFTER CORRECTION (B) | \|B/A\| |
|---|---|---|---|---|
| First [T/m] | x | $-0.157784 \times 10^{-3}$ | $-0.875583 \times 10^{-5}$ | $5.5 \times 10^{-2}$ |
| | y | $0.335424 \times 10^{-4}$ | $-0.207139 \times 10^{-5}$ | $6.2 \times 10^{-2}$ |
| | z | $-0.789541 \times 10^{-4}$ | $0.891007 \times 10^{-6}$ | $1.1 \times 10^{-2}$ |
| Second [T/m$^2$] | $z^2 - .5(x^2 + y^2)$ | $-0.203531 \times 10^{-3}$ | $-0.160401 \times 10^{-3}$ | $7.9 \times 10^{-1}$ |
| | zx | $-0.150949 \times 10^{-3}$ | $-0.115136 \times 10^{-4}$ | $7.6 \times 10^{-2}$ |
| | zy | $0.735409 \times 10^{-4}$ | $0.159563 \times 10^{-4}$ | $2.2 \times 10^{-1}$ |
| | xy | $-0.675666 \times 10^{-4}$ | $-0.148039 \times 10^{-4}$ | $2.2 \times 10^{-1}$ |
| | $x^2 - y^2$ | $0.330904 \times 10^{-4}$ | $-0.231282 \times 10^{-5}$ | $7.0 \times 10^{-2}$ |
| Third [T/m$^3$] | $z(z^2 - 1.5x^2 - 1.5y^2)$ | $-0.181378 \times 10^{-4}$ | $-0.371589 \times 10^{-4}$ | 2.0 |

What is claim is:

1. A process for correcting a crude magnetic field of a main field generator having n correcting magnetic field generators associated therewith to produce a substantially homogeneous corrected field, said process comprising the steps of:

measuring the intensity and direction of the crude magnetic field B of the main field generator at a plurality of different points within the field to obtain the distribution of the crude magnetic field;

expressing the crude magnetic field B at each of the plurality of different measured points by the following equation, which contains a main homogeneous magnetic field component, successively higher order inhomogeneous magnetic field components, and a residual:

$$Bz(x,y,z) = Bo + a_1 f_1 + a_2 f_2 + \ldots + a_n f_n + Rn(x,y,z)..;$$

determining the magnetic field output for a first one of the correcting generators such that a first one of the successively higher order inhomogeneous magnetic field components $a_1 f_1$ of the crude magnetic field B is completely cancelled by the magnetic field output $b_1 f_1$ of the first one of the correcting generators;

determining the magnetic field output for each of the remaining ones of the n correcting generators such that the successively higher order inhomogeneous magnetic field components $a_2 f_2 \ldots a_n f_n$ of the crude magnetic field B are completely cancelled by the magnetic field outputs $b_2 f_2 \ldots b_n f_n$, respectively, of the remaining ones of the n correcting generators;

producing the determined magnetic field outputs from the n correcting generators; and superpositioning on the crude magnetic field B of the main field generator the magnetic field outputs from the n correcting generators to provide a substantially homogeneous corrected field.

2. A process according to claim 1 wherein a main coil and n shim coils, respectively, are used as the main field generator and the correcting field generators, and wherein the steps of determining and producing, respectively, the correcting magnetic field outputs comprise calculating the amplitudes of the exciting currents for the n shim coils and exciting the n shim coils with the calculated currents.

3. A process according to claim 2 wherein a superconducting coil is used for at least one of the coils.

4. A process according to claim 1 wherein a permanent magnet is used for at least one of the generators.

5. A process according to claim 1 including the steps of measuring the distribution of the magnetic field B at various points B within the corrected field to confirm the homogeneity.

6. A process according to claim 2 in which the calculating steps use the method of least squares.

* * * * *